(12) United States Patent
Bao et al.

(10) Patent No.: US 11,961,895 B2
(45) Date of Patent: Apr. 16, 2024

(54) GATE STACKS WITH MULTIPLE HIGH-κ DIELECTRIC LAYERS

(71) Applicant: International Business Machines Corporation, Armonk, NY (US)

(72) Inventors: Ruqiang Bao, Niskayuna, NY (US); Ravikumar Ramachandran, Pleasantville, NY (US); Barry Linder, Hastings-on-Hudson, NY (US); Shahab Siddiqui, Clifton Park, NY (US); Elnatan Mataev, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 17/447,109

(22) Filed: Sep. 8, 2021

(65) Prior Publication Data

US 2023/0075740 A1    Mar. 9, 2023

(51) Int. Cl.
*H01L 29/49* (2006.01)
*H01L 29/40* (2006.01)
*H01L 29/51* (2006.01)

(52) U.S. Cl.
CPC ........ *H01L 29/4966* (2013.01); *H01L 29/401* (2013.01); *H01L 29/513* (2013.01); *H01L 29/517* (2013.01)

(58) Field of Classification Search
CPC .. H01L 29/4966; H01L 29/513; H01L 29/517
See application file for complete search history.

(56) References Cited

U.S. PATENT DOCUMENTS

| | | | |
|---|---|---|---|
| 6,407,435 B1 | 6/2002 | Ma et al. | |
| 6,627,503 B2 | 9/2003 | Ma et al. | |
| 6,645,882 B1 | 11/2003 | Halliyal et al. | |
| 6,670,248 B1 | 12/2003 | Ang et al. | |
| 6,753,224 B1 | 6/2004 | Lin et al. | |
| 7,923,336 B2 | 4/2011 | Lee et al. | |
| 8,476,126 B2 | 7/2013 | Chuang et al. | |
| 8,476,141 B2 | 7/2013 | Malhotra et al. | |
| 9,219,126 B2 | 12/2015 | Whiting et al. | |

(Continued)

FOREIGN PATENT DOCUMENTS

WO    2006110750 A2    10/2006

*Primary Examiner* — Joseph C. Nicely
(74) *Attorney, Agent, or Firm* — Kelsey M. Skodje (57) ABSTRACT

A first semiconductor device includes an interfacial layer over a substrate, a first high-κ dielectric layer over the interfacial layer, a second high-κ dielectric layer over the first high-κ dielectric layer, a Ti—Si mixing layer over the second high-κ dielectric layer, and a gate electrode layer over the Ti—Si mixing layer. A second semiconductor device includes an interfacial layer over a substrate, a first high-κ dielectric layer over the interfacial layer, a Ti—Si mixing layer over the first high-κ dielectric layer, a second high-κ dielectric layer over the Ti—Si mixing layer, and a gate electrode layer over the second high-κ dielectric layer. The method includes forming an interfacial layer over a substrate, forming a first high-κ dielectric layer over the interfacial layer, forming a second high-κ dielectric layer over the first high-κ dielectric layer, and forming a gate electrode layer over the second high-κ dielectric layer.

20 Claims, 6 Drawing Sheets

(56) References Cited

U.S. PATENT DOCUMENTS

| | | |
|---|---|---|
| 9,252,229 B2 | 2/2016 | Ando et al. |
| 9,330,938 B2 | 5/2016 | Ando et al. |
| 9,412,860 B2 | 8/2016 | Bai |
| 9,425,194 B2 | 8/2016 | Gerhardt et al. |
| 9,613,870 B2 | 4/2017 | Ando et al. |
| 9,721,842 B2 | 8/2017 | Ando et al. |
| 10,229,986 B1 | 3/2019 | Jagannathan et al. |
| 2003/0001188 A1 | 1/2003 | Nakagawa |
| 2005/0023628 A1 | 2/2005 | Senzaki |
| 2005/0062136 A1 | 3/2005 | Senzaki |
| 2005/0074982 A1 | 4/2005 | Lee et al. |
| 2005/0224897 A1 | 10/2005 | Chen et al. |
| 2006/0194451 A1 | 8/2006 | Lee et al. |
| 2008/0315310 A1 | 12/2008 | Rachmady et al. |
| 2011/0254106 A1* | 10/2011 | Katakami ............ H01L 29/517 257/E21.409 |
| 2012/0025327 A1* | 2/2012 | Ji .......................... H01L 29/513 257/E21.409 |
| 2013/0256812 A1 | 10/2013 | Yao et al. |
| 2020/0020595 A1 | 1/2020 | Bao et al. |
| 2020/0357700 A1 | 11/2020 | Wang |
| 2021/0375629 A1* | 12/2021 | Lai .................... H01L 21/31111 |
| 2021/0408229 A1* | 12/2021 | More .................. H01L 27/092 |
| 2023/0073400 A1* | 3/2023 | Tsai .................... H01L 21/0271 |

\* cited by examiner

GATE STACKS WITH MULTIPLE HIGH-κ DIELECTRIC LAYERS

BACKGROUND

The present disclosure relates to metal gate semiconductor devices and, more specifically, to gate stacks with more than one high-κ dielectric material layer.

Complementary metal oxide semiconductor (CMOS) technology can be used in devices such as field effect transistors (FETs), which can include multilayered metal gate stacks on semiconductor substrates. Properties of metal gate electrodes can be tuned by varying stack features such as the thickness of layers (e.g., dielectric and/or metal layers), the materials used (e.g., high-κ dielectrics, dopants), etc. For example, the threshold voltage of a gate can be tuned. The threshold voltage of a gate is the minimum gate-to-source voltage required to create a conducting path between the source and drain terminals of the gate. FET devices with higher threshold voltages can have reduced reliability and shortened lifetimes due to subthreshold leakage current.

SUMMARY

Various embodiments are directed to a semiconductor device that includes an interfacial layer over a substrate, a first high-κ dielectric layer over the interfacial layer, a second high-κ dielectric layer over the first high-κ dielectric layer, a Ti—Si mixing layer over the second high-κ dielectric layer, and a gate electrode layer over the Ti—Si mixing layer. The first high-κ dielectric layer may be thicker than the second high-κ dielectric layer. In some embodiments, there is a Ti-dopant mixing layer between the first high-κ dielectric layer and the second high-κ dielectric layer. In these instances, there may be a dipole at an interface between the first high-κ dielectric layer and the interfacial layer. The dopant may be lanthanum. The gate electrode layer can be an electrode such as TiN, polysilicon, aluminum, tungsten, a silicide, ruthenium(IV) oxide, $WN/RuO_2$, tantalum, TiAlC, TiAl, Ti, niobium, and tantalum nitride. In some embodiments, the first high-κ dielectric layer and the second high-κ dielectric layer are each a material independently selected from hafnium oxide, zirconium oxide, tantalum oxide, strontium titanate, titanium oxide, aluminum oxide, and yttrium oxide.

Additional embodiments are directed to a semiconductor device that includes an interfacial layer over a substrate, a first high-κ dielectric layer over the interfacial layer, a Ti—Si mixing layer over the first high-κ dielectric layer, a second high-κ dielectric layer over the Ti—Si mixing layer, and a gate electrode layer over the second high-κ dielectric layer. In some embodiments, there is a dipole, which can be induced by a dopant, at an interface between the first high-κ dielectric layer and the interfacial layer. There may also be a second gate electrode layer over the gate electrode layer. The gate electrode layers can be electrodes such as TiN, polysilicon, aluminum, tungsten, a silicide, ruthenium(IV) oxide, $WN/RuO_2$, tantalum, TiAlC, TiAl, Ti, niobium, and tantalum nitride.

Further embodiments are directed to a method of forming a semiconductor device stack. The method includes forming an interfacial layer over a substrate, forming a first high-κ dielectric layer over the interfacial layer, forming a second high-κ dielectric layer over the first high-κ dielectric layer, and forming a gate electrode layer over the second high-κ dielectric layer. The method can also include forming a Ti—Si mixing layer directly over the second high-κ dielectric layer. In some embodiments, the method includes forming a Ti—Si mixing layer or a Ti-dopant mixing layer directly over the first high-κ dielectric layer. In embodiments involving the Ti-dopant mixing layer, the second high-κ dielectric layer can be formed by depositing a high-κ dielectric material on the Ti-dopant mixing layer. A dipole can then be induced at an interface between the interfacial layer and the first high-κ dielectric layer, and a Ti—Si mixing layer can be formed over the second high-κ dielectric layer. In other embodiments involving the Ti-dopant mixing layer, the method can include inducing a dipole at an interface between the interfacial layer and the first high-κ dielectric layer, removing the Ti-dopant mixing layer, forming a Ti—Si mixing layer over the first high-κ dielectric layer, and depositing a high-κ dielectric material on the Ti—Si mixing layer to form the second high-κ dielectric layer. The dopant in the Ti-dopant mixing layer can be lanthanum, magnesium, aluminum, or yttrium in some embodiments. The method may also include forming a second gate electrode layer over the gate electrode layer.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings, and will be described in detail. It should be understood, however, that the intention is not to limit the invention to the particular embodiments described. Instead, the intention is to cover all modifications, equivalents, and alternatives falling within the spirit and scope of the invention.

DETAILED DESCRIPTION

Embodiments of the present invention are generally directed to metal gate semiconductor devices and, more specifically, to gate stacks with more than one high-κ dielectric material layer. While the present disclosure is not necessarily limited to such applications, various aspects of the disclosure may be appreciated through a discussion of examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "over," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Unless otherwise noted, ranges (e.g., time, concentration, temperature, etc.) indicated herein include both endpoints and all numbers between the endpoints. Unless specified otherwise, the use of a tilde (~) or terms such as "about," "substantially," "approximately," "slightly less than," and variations thereof are intended to include the degree of error associated with measurement of the particular quantity based upon the equipment available at the time of filing the application. For example, "about" can include a range of ±8% or 5%, or 2% of a given value, range of values, or endpoints of one or more ranges of values. Unless otherwise indicated, the use of terms such as these in connection with a range applies to both ends of the range (e.g., "approximately 1 g-5 g" should be interpreted as "approximately 1 g-approximately 5 g") and, in connection with a list of ranges, applies to each range in the list (e.g., "about 1 g-5 g, 5 g-10 g, etc." should be interpreted as "about 1 g-about 5 g, about 5 g-about 10 g, etc.").

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It should also be understood that material compounds will be described in terms of listed elements, e.g., SiN, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (ME). In general, ME uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, semiconductor devices can be used in the control and conversion of electrical power. Examples of semiconductor devices can include diodes, thyristors, field-effect transistors (FETs), etc. FETs can be found in integrated circuits, power supplies, DC-to-DC converters, low voltage motor controllers, etc. Examples of FETs can include insulated-gate bipolar transistors (IGBTs), junction gate FETs (JFETs), metal-semiconductor FETs (MESFETs), metal-insulator-semiconductor FETs (MISFETs), metal-oxide-semiconductor FETs (MOSFETs), metal-nitride-oxide-semiconductor (MNOS) transistors, dual-gate MOSFETs, fast-reverse epitaxial diode FETs (FREDFETs), heterostructure insulated gate FETs (HIGFETs), modulation-doped FETs (MODFETs), tunnel FETs (TFETs), high-electron-mobility FETs (HEMFETs), ion-sensitive FETs (ISFETs), biologically-sensitive FETs (BioFETs), nanoparticle organic memory FETs (NOMFETs), graphene nanoribbon FETs (GNRFETs), vertical-slit FETs (VeFETs), carbon nanotube FETs (CNFETs), organic FETs (OFETs), quantum FETs (QFETs), etc.

For example, complementary metal-oxide-semiconductor (CMOS) technology uses MOSFETs as primary components of integrated circuits. These devices include a multilayered stack fabricated on a semiconductor substrate (e.g., a silicon wafer). A metal gate stack includes a work function metal layer over a dielectric layer, which is above the semiconductor substrate. MOSFETs can be categorized into families such as high performance logic devices (e.g., microprocessors), low operating power logic devices (e.g., laptop/notebook computers) and low standby power logic devices (e.g., smart phones). High performance (HP) devices require a low threshold voltage ($V_{th}$), short channel length, and thin dielectric layer. Improvements to computing power have been achieved by scaling MOSFET features such as supply voltage, channel length, and thickness of dielectric layer. However, scaling of devices, e.g., by thinning of dielectric layers, can cause substantial subthreshold gate leakage currents, resulting in reliability issues and breakdown of devices. Reliability issues can include bias temperature instability, reduction in channel mobility, time dependent dielectric breakdown (TDDB), hot carrier induced degradation, etc.

Reliability issues caused by thinning of dielectric layers in gate stacks can be minimized by replacing convention dielectric materials (e.g., silicon oxides or silicon oxynitrides) with high-κ dielectrics, such as oxides of hafnium (Hf) or zirconium (Zr). These materials have higher dielectric constants (κ) than conventional dielectrics, such as silicon oxides ($\kappa_{SiO2}$=3.9). In some embodiments, the dielectric constant of a high-κ dielectric material is greater than about 12. For example, $HfO_2$ has a dielectric constant of about 25-30. The threshold voltage can be modulated by creating a dipole in the high-κ dielectric layer of a gate stack. For example, HP devices such as p-type FETs (PFETs) used in servers can require an increased $V_{th}$, which can significantly reduce the time-to-fail of the device.

Embodiments of the present disclosure may improve the reliability of gate stacks such as these, e.g., by reducing TDDB. Disclosed herein are device gate stacks with multiple layers of high-κ dielectric material. Embodiments of the present disclosure include a semiconductor device with an interfacial layer over a substrate, first and second high-k dielectric layers, a Ti—Si mixing layer over the second high-k dielectric layer, and a gate electrode over the mixing layer. Additional embodiments include a semiconductor device with an interfacial layer over a substrate, a first high-k dielectric layer over the interfacial layer, a Ti—Si mixing layer over the first high-k dielectric layer, a second high-k dielectric layer over the Ti—Si mixing layer, and a gate electrode over the second high-k dielectric layer. Embodiments of the present disclosure also methods for fabricating semiconductor devices with multiple high-k dielectric layers.

Figure 1A:
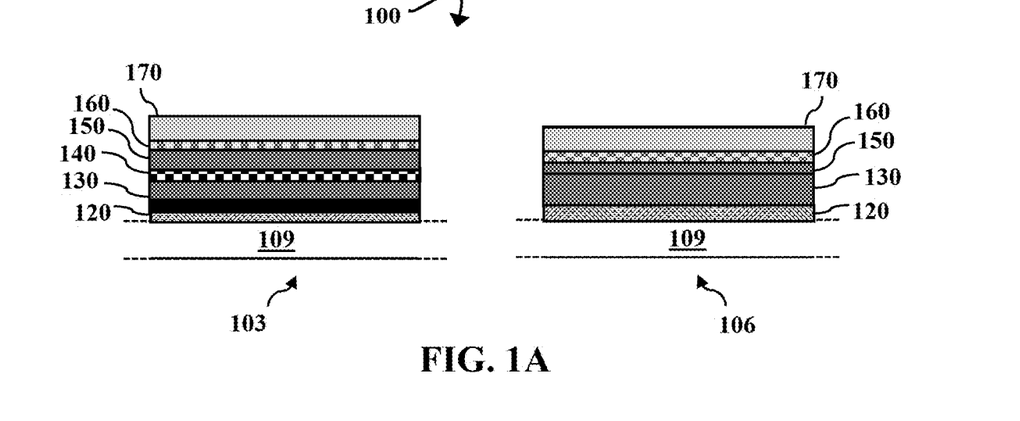
FIGS. 1A-1C are block diagrams illustrating cross-sectional views of metal gate stacks with multiple high-κ dielectric layers, according to some embodiments of the present disclosure.
Figure 1B:
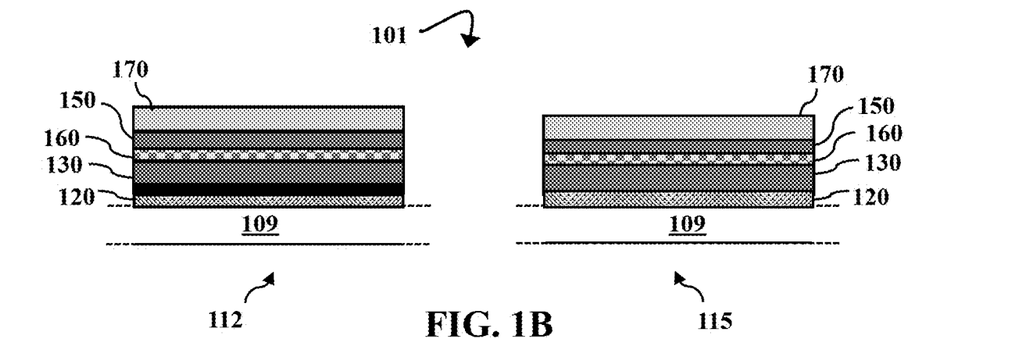
Figure 1C:
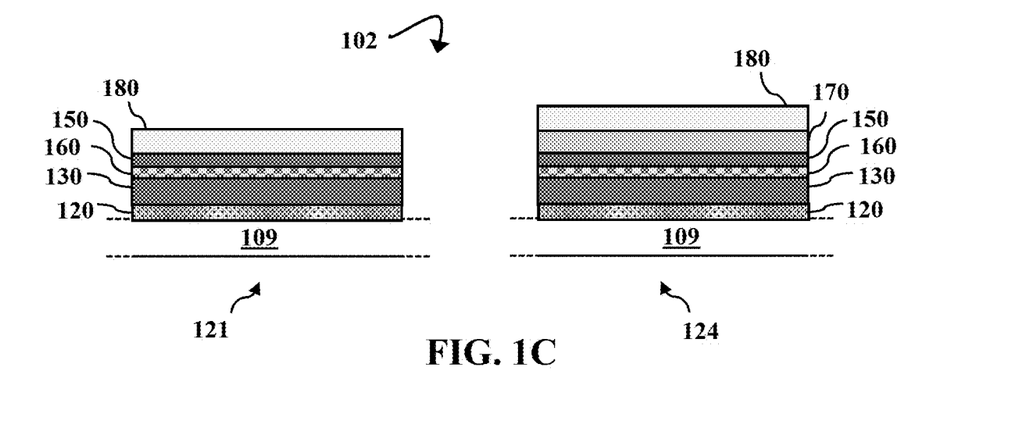

Referring now to the drawings, in which like numerals represent the same or similar elements, FIGS. 1A, 1B, and 1C are block diagrams illustrating gate stacks having more than one high-κ dielectric layer. FIGS. 2A-3B illustrate processes of fabricating these gate stacks.

FIG. 1A illustrates cross-sectional views 100 of a dipole device stack 103 and a non-dipole device stack 106, according to some embodiments of the present disclosure. Herein, "dipole device" refers to a semiconductor device with a dipole in a layer of high-κ dielectric material. The dipole can be induced with a dopant such as lanthanum, yttrium, or magnesium. In FIG. 1A, the devices 103 and 106 are on a substrate 109, which can be a semiconductor substrate such as a silicon wafer. Only the portions of the substrate 109 on which the devices 103 and 106 have been formed are illustrated in FIG. 1A. However, it should be understood that the substrate 109 can include additional dipole and/or non-dipole gate stacks, regions without device stacks, features such as sidewall isolation structures, doped source and drain structures, metallic contacts, etc. These additional components/regions are not illustrated herein. While the substrate 109 is illustrated as a simple rectangle, it should be understood that the illustrated substrate 109 can represent any appropriate shape and orientation. For example, the substrate 109 can be representative of planar or non-planar transistors such as finFETs, surround-gate FETs, multiple-gate FETs, nanowire or nanosheet FETs, vertical FETs, etc.

The substrate 109 can be a silicon semiconductor. The substrate 109 is p-doped silicon (p-Si) in some embodiments. However, the substrate 109 can have undoped, p-doped, and/or n-doped regions. The substrate 109 may be a semiconductor other than silicon in some embodiments. For example, semiconductors that can form the substrate 109 may include silicon-germanium, germanium, graphene, amorphous silicon, polycrystalline silicon, organic semiconductors, silicon carbide (SiC), gallium arsenide (GaAs), gallium nitride (GaN), indium gallium arsenide (InGaAs), etc.

Device stacks 103 and 106 each have an interfacial layer (IL) 120 between the substrate 109 and a first high-κ dielectric (HK1) layer 130. For example, IL 120 can be a layer of $SiO_x$ (e.g., $SiO_2$) formed by oxidation at the surface of a silicon substrate 109. The HK1 layer 130 can be a layer of hafnium oxide (e.g., $HfO_2$). Other high-κ dielectric materials that may be used can include zirconium oxide, tantalum oxide, strontium titanate, titanium oxide, aluminum oxide, yttrium oxide, etc. The dipole device 103 has a dipole at the interface of IL 120 and HK1 130. Herein, the approximate position of a dipole is represented by a black bar. Dipole device stack 103 has a Ti-dopant mixing layer 140 on the surface of the HK1 layer 130. The Ti-dopant mixing layer 140 can include a mixture of lanthanum and titanium (Ti—La) at the surface of HK1 130 when the dopant is lanthanum. In other embodiments, the Ti-dopant mixing layer 140 can have an element other than La. For example, layer 140 can be a Ti—Zr layer if lanthanum is replaced by zirconium as a dipole-inducing dopant. This is discussed in greater detail below.

Device stacks 103 and 106 each have a second high-κ dielectric (HK2) layer 150. In dipole device stack 103, the Ti-dopant mixing layer 140 is between the HK1 layer 130 and the HK2 layer 150. In non-dipole device stack 106, the HK2 layer 150 is directly over the HK1 layer 130. The HK1 layer 130 and HK2 layer 150 can be the same or different high-κ dielectric materials. For example, HK1 and HK2 can both be $HfO_2$. In other embodiments, HK1 can be $HfO_2$ and HK2 can be $ZrO_2$, or vice versa.

Both device stacks 103 and 106 have a Ti—Si mixing layer 160 over the HK2 layer 150. The Ti—Si mixing layer 160 includes Ti and Si at the surface of the HK2 layer 150. In each device stack 103 and 106, a gate electrode 170 (work function metal layer) is positioned over the Ti—Si mixing layer 160. The gate electrode 170 can include a titanium nitride (TiN) film in some embodiments. While gate electrodes are conventionally referred to as metal gate electrodes, appropriate non-metals can be used as well. For example, persons of ordinary skill will understand that the gate electrode 170 may be a layer of any appropriate gate material, such as polycrystalline silicon (polysilicon), aluminum, a silicide (e.g., TiSi, MoSi, TaSi, WSi, etc.), ruthenium oxide ($RuO_2$), $WN/RuO_2$, tantalum, niobium, TiAlC, TiAl, tantalum nitride, etc.

FIG. 1B illustrates cross-sectional views 101 of a second dipole device stack 112 and non-dipole device stack 115, according to some embodiments of the present disclosure. Dipole device 112 and non-dipole device 115 can include layers of materials the same as or substantially similar to those of dipole device 103 and non-dipole device 106 illustrated in FIG. 1A. The same reference numbers are used to refer to these layers/materials in each figure. Dipole device 112 is illustrated on substrate 109 and has an interfacial layer (IL) 120 between the substrate 109 and HK1 layer 130. There is a Ti—Si mixing layer 160 over the HK1 layer 130. An HK2 layer 150 is positioned above the Ti—Si mixing layer 160 and below a gate electrode 170. In contrast to device stacks 103 and 106 of FIG. 1A, the HK2 layer 150 of device stacks 112 and 115 is in contact with the gate electrode 170. Further, dipole device stack 112 does not include a Ti-dopant mixing layer 140 between HK1 130 and HK2 150. This is discussed in greater detail with respect to FIGS. 2A-2C.

FIG. 1C illustrates cross-sectional views 102 of two non-dipole device stacks 121 and 124, according to some embodiments of the present disclosure. Non-dipole device stacks 121 and 124 can include layers of materials the same as or substantially similar to those illustrated in FIGS. 1A and 1B. The same reference numbers are used to refer to these layers/materials in each figure.

The non-dipole devices 121 and 124 each have an interfacial layer 120, an HK1 layer 130, an HK2 layer 150, and a Ti—Si mixing layer 160 on a substrate 109 in substantially the same configuration as non-dipole device 112 (FIG. 1B). Non-dipole device 124 includes gate electrode 170 below another gate electrode 180, which can be a work function metal layer used to adjust the work function of gate electrode 170. Non-dipole device 121 includes gate electrode 180 over the layer of HK2 150 but does not include the first gate electrode 170. In some embodiments, both gate electrodes 170 and 180 can include the same material (e.g., TiN). However, gate electrodes 170 and 180 can be different materials. Gate electrodes 170 and 180 can be independently selected from materials such as TiN, polysilicon, aluminum, tungsten, a silicide (e.g., TiSi, MoSi, TaSi, WSi, etc.), ruthenium(IV) oxide, $WN/RuO_2$, tantalum, TiAlC, TiAl, niobium, tantalum nitride.

The gate configurations shown in FIGS. 1A, 1B, and 1C are formed using various fabrication techniques. These techniques include forming an interfacial layer over a substrate, forming a first high-κ dielectric layer over the interfacial layer, forming a second high-κ dielectric layer over the first high-κ dielectric layer, and forming a gate electrode over the second high-κ dielectric layer. Additional techniques are used to introduce additional layers, dipoles, and other variations, which are discussed in greater detail with respect to FIGS. 2A-3B. To illustrate these techniques, but not to limit embodiments, FIGS. 2A-3B are described within the context of gate stacks 100, 101, and 102. Where elements referred to in FIGS. 2A-3B are the same as elements shown in FIGS. 1A-1C, the same reference numbers are used.

Figure 2A:
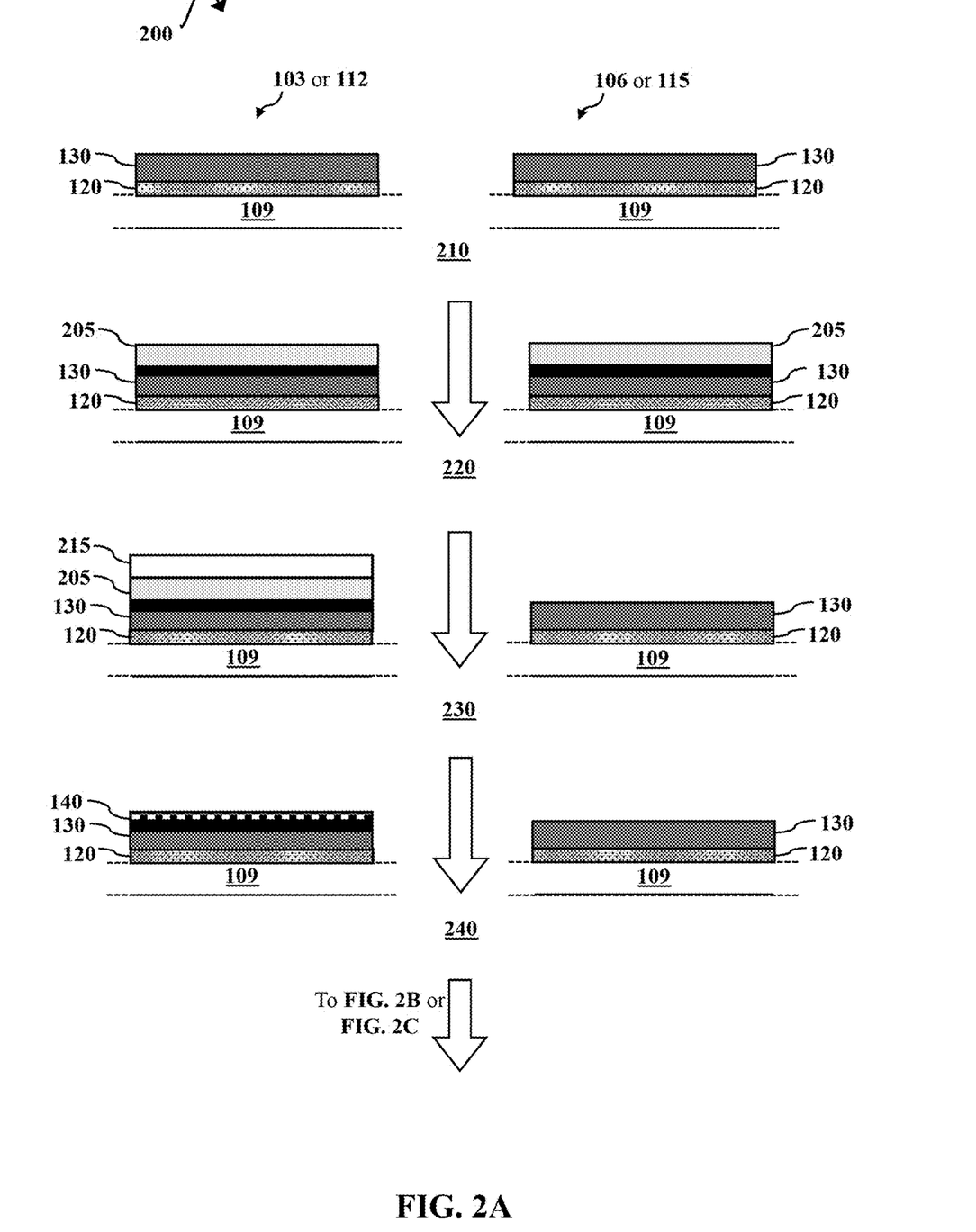
FIG. 2A is a schematic diagram illustrating a process of forming a first high-κ dielectric layer on a semiconductor substrate, according to some embodiments of the present disclosure.

FIG. 2A is a schematic diagram illustrating a process 200 of forming initial layers for device stacks 103 and 106 (FIG. 1A) or device stacks 112 and 115 (FIG. 1B), according to some embodiments of the present disclosure.

An interfacial layer (IL) 120 and a first layer of a high-κ dielectric (HK1) 130 are formed on substrate 109. This is illustrated at operation 210. The interfacial layer 120 can be a $SiO_2$-containing (e.g., about 10% $SiO_2$) layer grown via nucleation on a Si substrate 109 prior to the deposition of HK1 130. In other embodiments, the interfacial layer 120 can be formed under oxidative growth conditions during the deposition of HK1 130. The interfacial layer may contain nitrogen or other elements such germanium. In some embodiments, the interfacial layer thickness is about 5 Å-15 Å. In other embodiments, such as those involving high voltage devices, the interfacial layer can be about 15 Å-50 Å thick. The interfacial layer 120 can facilitate nucleation of HK1 130. The layer of HK1 130 can be formed via deposition techniques such as chemical vapor deposition (CVD) or atomic layer deposition (ALD). For example, HK1 can be amorphous $HfO_2$ formed by ALD. The thickness of HK1 130 can be varied based on the number of ALD cycles carried out. In some embodiments, the thickness of the HK1 layer 130 is within a range of about 10 Å-30 Å.

A blocking layer 205 over a dipole-inducing dopant material is formed on the HK1 layer 130. This is illustrated at operation 220. In some embodiments, the blocking layer 205 includes titanium. For example, the blocking layer can include TiN. Herein, the position of a dipole at an interface between two layers in dipole device stacks 103 and 112 is indicated by a black bar at the interface. The dopant in the blocking layer 205 can include lanthanum or another appropriate dipole-inducing element (e.g., magnesium, aluminum, yttrium, etc.). For example, a lanthanum source can be a film of La or a lanthanum oxide (e.g., $La_2O_3$) deposited on the surface of HK1 130. TiN can then be deposited over the La-containing film to form the blocking layer 205.

The blocking layer 205 is lithographically patterned in order to prepare a dipole device stack 103 or 112 and a non-dipole device stack 106 or 115. This is illustrated at operation 230. A masking layer 215 is selectively deposited over the blocking layer 205 at the dipole device stack 103/112. The masking layer 215 includes a resist, such as a photoresist. While the illustrated masking layer 215 is a positive tone resist, the patterning can be carried out with a negative tone resist in other embodiments. As will be understood by persons of ordinary skill, any appropriate lithographic techniques can be used for this and other patterning steps illustrated herein. At operation 230, regions of the blocking layer 215 are selectively removed, exposing the surface of the HK1 layer 130 at the non-dipole device stack 106/115.

The masking layer 215 is removed, followed by removal/thinning of the patterned blocking layer 205. This is illustrated at operation 240. The masking layer 215 can be removed using any appropriate techniques for removing patterning masks. Wet etching or other removal processes can be used to thin the blocking layer 205, resulting in a Ti-dopant mixing layer 140 on the surface of the HK1 layer 130 at the dipole device stack 102/112. Process 200 forms the initial dipole and non-dipole layers on which device stacks 103 and 106 or device stacks 112 and 115 can be built. Additional fabrication steps for device stacks 103 and 106 are illustrated in FIG. 2B, and additional fabrication steps for device stacks 112 and 115 are illustrated in FIG. 2C.

Figure 2B:
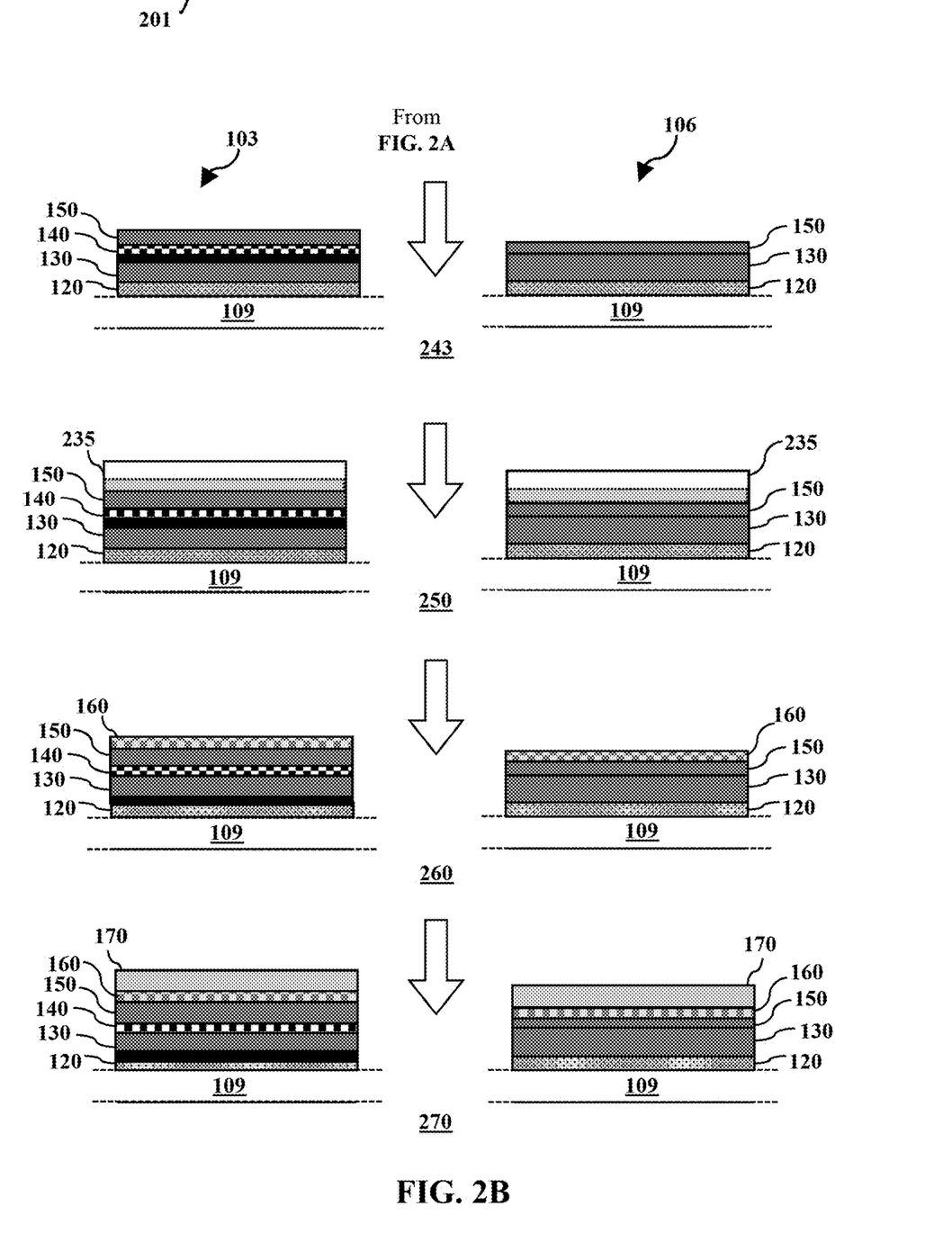
FIGS. 2B and 2C are schematic diagrams illustrating processes of forming gate stacks with second high-κ dielectric layers over the first dielectric layer on the semiconductor substrate, according to some embodiments of the present disclosure.
Figure 2C:
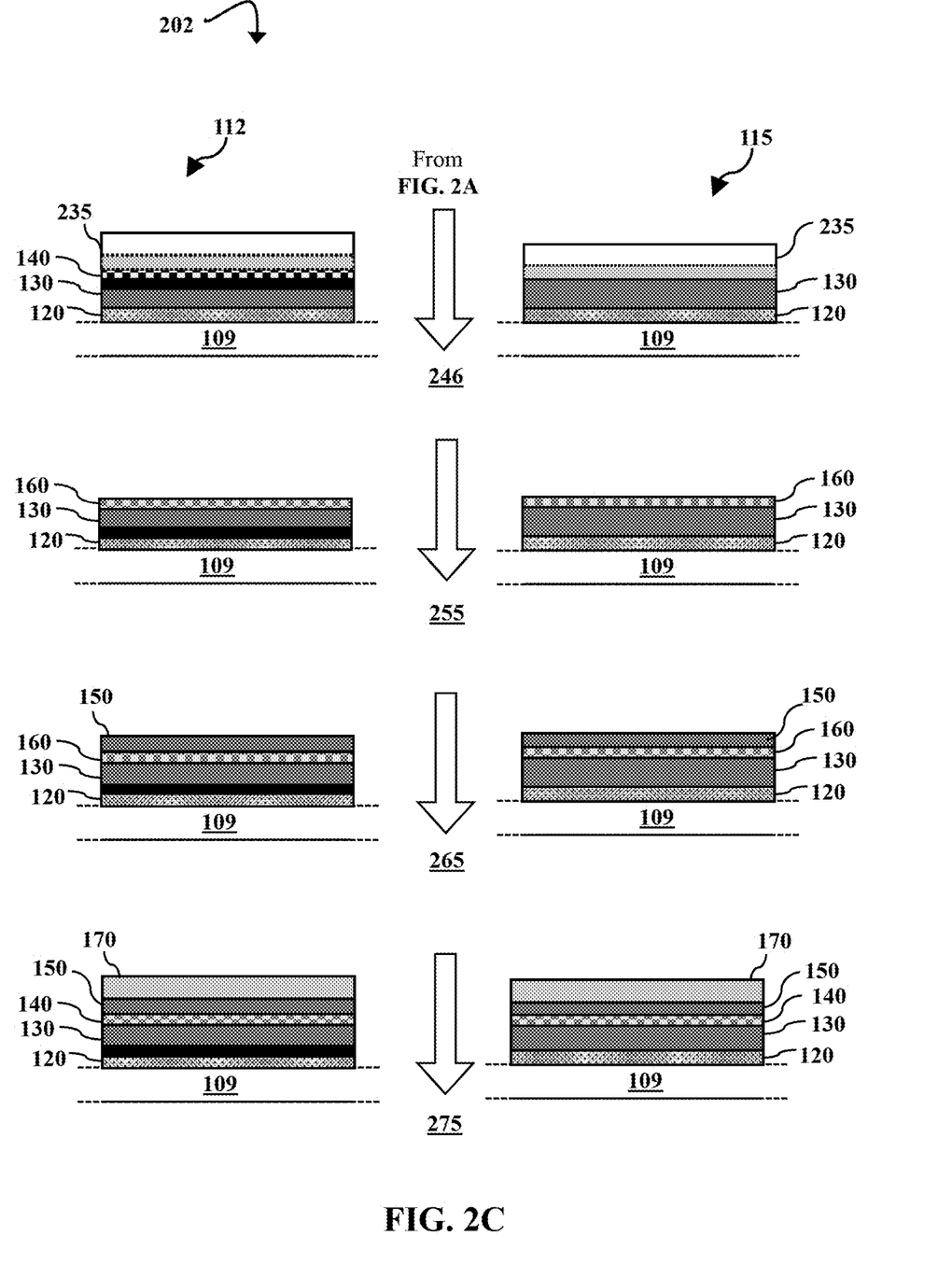

FIG. 2B is a schematic diagram illustrating a process 201 of forming the dipole device stack 103 and the non-dipole device stack 106 of FIG. 1A, according to some embodiments of the present disclosure. An HK2 layer 150 is deposited over device stacks 103 and 106 as prepared in process 200 (FIG. 2A). This is illustrated at operation 243. This results in a dipole device stack 103 with the HK2 layer 150 on top of the Ti—La mixing layer 140 and a non-dipole device stack 106 with the HK2 layer 150 on top of the HK1 layer 130. The deposition of HK2 150 can be carried out using techniques and materials substantially similar to those of HK1 130 at operation 210 of process 200. For example, the HK2 layer 150 can be formed by ALD or CVD. In some embodiments, HK1 130 and HK2 150 are the same material (e.g., amorphous $HfO_2$). In other embodiments, HK1 130 and HK2 150 are not the same material. For example, HK1 130 can be $HfO_2$ and HK2 150 can be $ZrO_2$, or vice versa. In some embodiments, HK1 130 may be thicker than HK2 150. For example, the HK1 130 and HK2 layers 150 can be about 10 Å-30 Å and about 1 Å-6 Å, respectively. In other embodiments, HK1 130 and HK2 150 may be about the same thickness. Further, HK1 130 may be thinner than HK2 150 in other embodiments. Adjusting the thickness and composition of layers 130 and 150 may be used to adjust the threshold voltage of device stacks 103 and 106.

An annealing stack 235 is formed on device stacks 103 and 106, which are then annealed. This is illustrated at operation 250. The annealing stack 235 can be multi-layered. This is illustrated herein by the white upper section and gray lower section of the annealing stack 235. For example, the annealing stack 235 can include a layer of amorphous silicon over a cap film of TiN deposited on the HK2 layer 150. In some embodiments, the cap film is a material containing Ti, such as TiN. The anneal may take place at any appropriate temperature for driving the lanthanum in the Ti-dopant mixing layer 140 far enough into the HK1 layer 130 to move the dipole to the HK1 layer 130/IL 120 interface (see below), e.g., a temperature range between about 800° C.-1300° C. Annealing techniques that may be used can include a rapid thermal anneal (RTA), soke anneal, laser anneal, furnace anneal etc.

The annealing stack 235 is then thinned, resulting in a Ti—Si mixing layer 160 over the HK2 layer 150 at both device stacks 103 and 106. This is illustrated at operation 260. The thinning can be carried out using wet etching cycles or other TiN and Si removal techniques. At operation 260, the dipole device stack 103 is illustrated with a dipole (black bar) at the interface between layers 130 and 120. This dipole is formed during the anneal at operation 250 when lanthanum is driven from the Ti—La layer 140 toward the interfacial layer 120. However, a portion of the Ti-dopant mixing layer 140 remains between the HK1 layer 130 and the HK2 layer 150.

A work function metal is then deposited and patterned to form a gate electrode 170 over each device stack 103 and 106. This is illustrated at operation 270. While the gate electrode 170 is illustrated as a simple rectangle, the gate electrode 170 can be a multilayered stack. The gate electrode 170 can include a film of TiN. Examples of gate electrode 170 materials that may be used are discussed in greater detail with respect to FIG. 1A. Any conventional deposition and lithographic techniques for gate electrode fabrication can be used. Examples of these techniques are discussed in greater detail above.

FIG. 2C is a schematic diagram illustrating a process 201 of forming the dipole device stack 112 and the non-dipole device stack 115 of FIG. 1B, according to some embodiments of the present disclosure. An annealing stack 235 is formed on device stacks 112 and 115 as prepared in process 200 (FIG. 2A), which are then annealed. This is illustrated at operation 246. The annealing stack 235 can be multi-layered. This is illustrated herein by the white upper section and gray lower section of the annealing stack 235. For example, the annealing stack 235 can include a layer of amorphous silicon over a Ti-containing film (e.g., TiN) deposited on the Ti-dopant mixing layer 140 of dipole device stack 112 and the HK1 layer of non-dipole device 115. The anneal may take place at any appropriate temperature for driving the dipole from the Ti-dopant mixing layer 140 to the HK1 layer 130/IL 120 interface, e.g., a temperature range between about 800° C.-1300° C. Annealing techniques that may be used can include a rapid thermal anneal (RTA), soke anneal, laser anneal, furnace anneal etc.

The annealing stack 235 is then thinned, resulting in a Ti—Si mixing layer 160 over the HK1 layer 130 at both device stacks 112 and 115. This is illustrated at operation 255. The Ti-dopant mixing layer 140 is replaced by the Ti—Si mixing layer 160 of dipole device 112. The thinning can be carried out using wet etching cycles or other TiN and Si removal techniques. At operation 255, the dipole device stack 112 is illustrated with a dipole (black bar) at the interface between layers 130 and 120. This dipole is formed during the anneal at operation 250 when lanthanum is driven from the Ti-dopant mixing layer 140 toward the interfacial layer 120.

An HK2 layer 150 is deposited onto the Ti—Si mixing layer 160 of device stacks 112 and 115. This is illustrated at operation 265. The HK2 layer 150 can be formed using substantially the same techniques and materials as those discussed in greater detail with respect to operation 243 of process 201 (FIG. 2B). A work function metal is then deposited and patterned to form a gate electrode 170 over each device stack 112 and 115. This is illustrated at operation 275. Operation 275 can be carried out using substantially the same techniques and materials as those discussed in greater detail with respect to operation 270 of process 201.

Figure 3A:
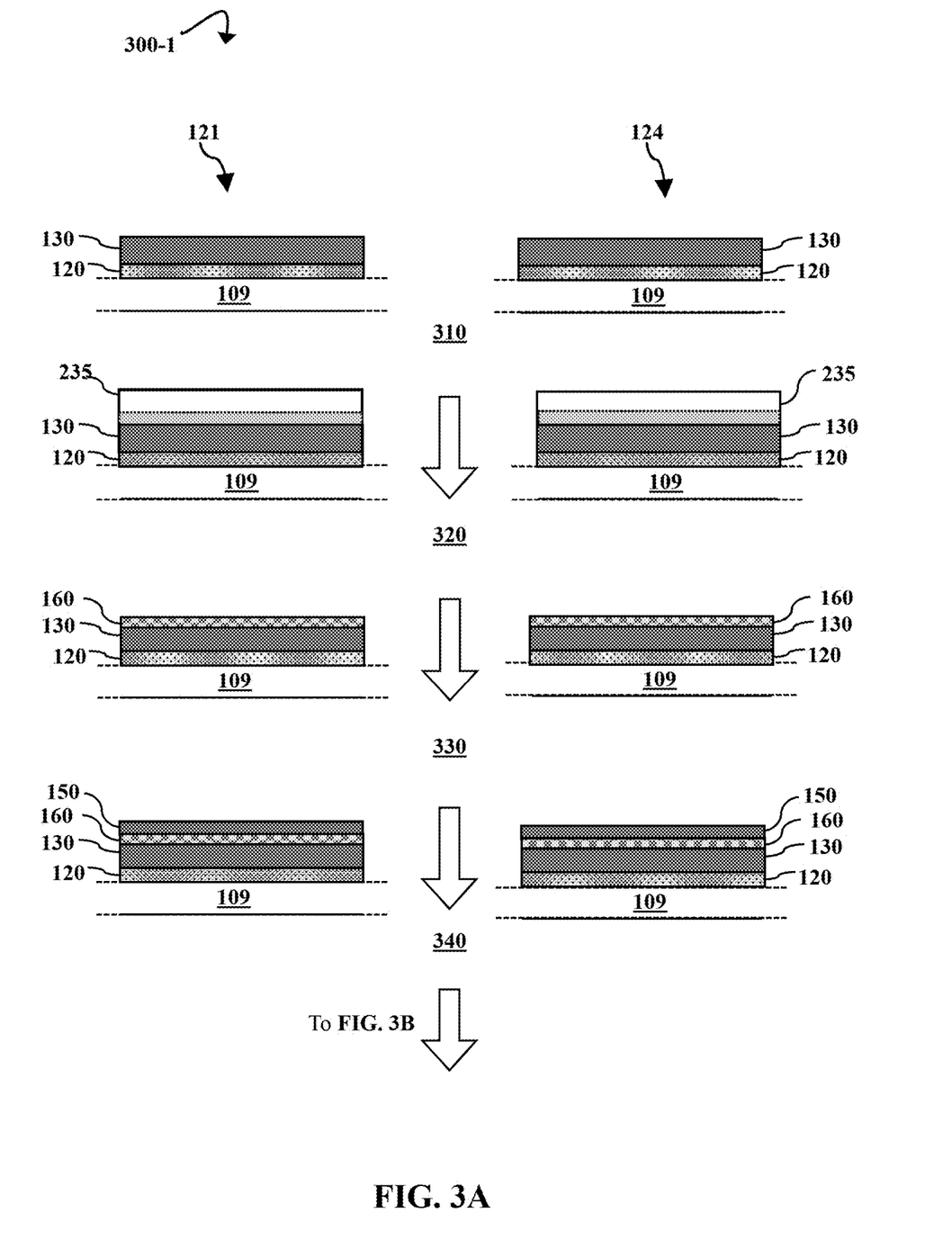
FIGS. 3A and 3B are schematic diagrams illustrating a process of forming gate stacks with first and second high-κ dielectric layers, according to some embodiments of the present disclosure.
Figure 3B:
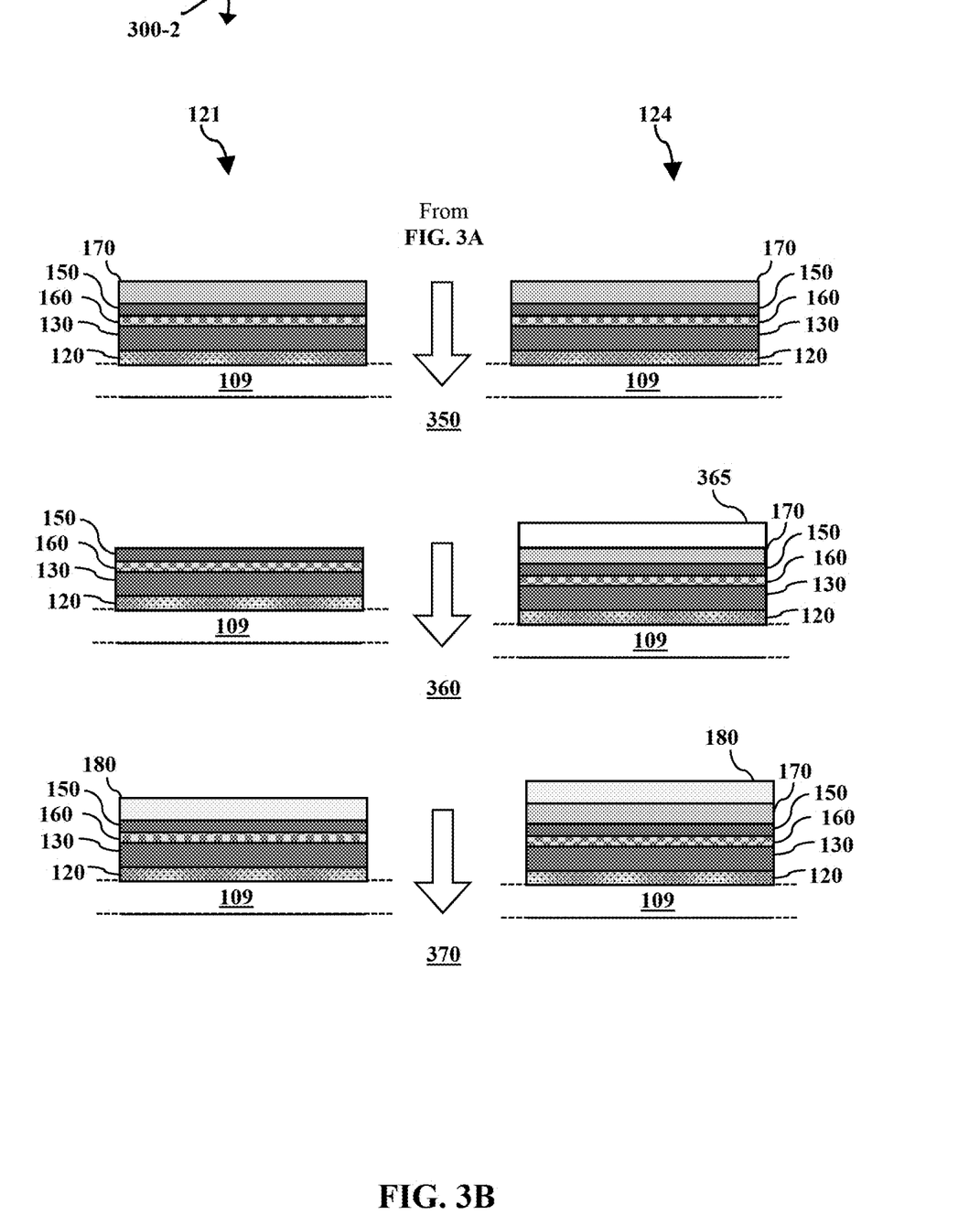

FIGS. 3A and 3B illustrate processes 300-1 and 300-2 (collectively, 300) of forming two non-dipole device stacks 121 and 124, according to some embodiments of the present disclosure.

An interfacial layer (IL) 120 and a first layer of a high-κ dielectric (HK1) 130 are formed on substrate 109. This is illustrated at operation 310. The interfacial layer 120 can be a $SiO_2$-containing (e.g., about 10% $SiO_2$) layer grown via nucleation on a Si substrate 109 prior to the deposition of HK1 130. In other embodiments, the interfacial layer 120 can be formed under oxidative growth conditions during the deposition of HK1 130. The interfacial layer may contain nitrogen or other elements such germanium. In some embodiments, the interfacial layer thickness is about 5 Å-15 Å. In other embodiments, such as those involving high voltage devices, the interfacial layer can be about 15 Å-50 Å thick. The layer of HK1 130 can be formed via deposition techniques such as chemical vapor deposition (CVD) or atomic layer deposition (ALD). For example, HK1 130 can be amorphous $HfO_2$ formed by ALD. The thickness of HK1 130 can be varied based on the number of ALD cycles carried out. In some embodiments, the thickness of the HK1 layer 130 is within a range of about 10 Å-30 Å.

An annealing stack 235 is formed on device stacks 121 and 124, which are then annealed. This is illustrated at operation 320. The annealing stack 235 can be multi-layered. This is illustrated herein by the white upper section and gray lower section of the annealing stack 235. For example, the annealing stack 235 can include a layer of amorphous silicon over a film of TiN deposited on the HK1 layer of non-dipole devices 121 and 124. The anneal may take place at any appropriate temperature, e.g., a temperature range between about 800° C.-1300° C. Annealing techniques that may be used can include a rapid thermal anneal (RTA), soke anneal, laser anneal, furnace anneal etc.

The annealing stack 235 is then thinned, resulting in a Ti—Si mixing layer 160 over the HK1 layer 130 at both device stacks 121 and 124. This is illustrated at operation 330. An HK2 layer 150 is deposited onto the Ti—Si mixing layer 160 of the device stacks 121 and 124. This is illustrated at operation 340. The HK2 layer 150 can be formed using substantially the same techniques and materials as those discussed in greater detail with respect to operation 243 of process 201 (FIG. 2B). Process 300 is continued in FIG. 3B.

Referring now to FIG. 3B, a first work function metal layer (gate electrode 170) is deposited over device stacks 121 and 124. This is illustrated at operation 350. Various materials can be used (e.g., TiN, TiSi, MoSi, TaSi, WSi, ruthenium(IV) oxide, TiAlC, TiAl, WN/$RuO_2$, tantalum, niobium, tantalum nitride, etc.) to form the first gate electrode 170. This is discussed in greater detail with respect to FIG. 1C.

The gate electrode 170 is removed from device stack 121. This is illustrated at operation 360. Any conventional lithographic techniques appropriate for removing a work function metal layer can be used. A blocking layer 365 is positioned over device stack 124 in order to protect the first gate electrode 170 on device 124. The blocking layer 365 can be removed after removing layer 170 from device stack 121.

A second work function metal is then deposited over device stacks 121 and 124 and patterned to form gate electrode 180. This is illustrated at operation 370. Non-dipole device 121 includes gate electrode 180 over the layer of HK2 150 and does not include the first gate electrode 170. Non-dipole device 124 has both gate electrode layers 170 and 180. In some embodiments, the first 170 and second electrode 180 materials are selected in order to adjust the work function of the device 124. Material selection based on work function and/or other properties is known to those of ordinary skill in the art. Examples of gate electrode 170 materials that may be used are discussed in greater detail with respect to FIG. 1A. Any conventional deposition and lithographic techniques for gate electrode fabrication can be used. Examples of these techniques are discussed in greater detail above. In some embodiments, the formation of gate electrode 180 is substantially similar to the formation of gate electrode 170 in examples illustrated in FIGS. 2A-3A.

The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    an interfacial layer over a substrate;
    a first high-k dielectric layer over the interfacial layer;
    a Ti-dopant mixing layer over the first high-k dielectric layer;
    a second high-k dielectric layer over the Ti-dopant mixing layer;
    a Ti—Si mixing layer over the second high-k dielectric layer; and
    a gate electrode layer over the Ti—Si mixing layer.

2. The semiconductor device of claim 1, further comprising a dipole at an interface between the first high-k dielectric layer and the interfacial layer.

3. The semiconductor device of claim 1, wherein the Ti-dopant mixing layer comprises lanthanum.

4. The semiconductor device of claim 1, wherein the gate electrode layer is an electrode selected from the group consisting of TiN, polysilicon, aluminum, tungsten, a silicide, ruthenium(IV) oxide, WN/$RuO_2$, tantalum, TiAlC, TiAl, Ti, niobium, and tantalum nitride.

5. The semiconductor device of claim 1, wherein the first high-k dielectric layer and the second high-k dielectric layer are independently selected from the group consisting of hafnium oxide, zirconium oxide, tantalum oxide, strontium titanate, titanium oxide, aluminum oxide, and yttrium oxide.

6. The semiconductor device of claim 1, wherein the first high-k dielectric layer is thicker than the second high-k dielectric layer.

7. The semiconductor device of claim 1, wherein the Ti-dopant mixing layer comprises a dopant selected from the group consisting of lanthanum, zirconium, magnesium, aluminum, and yttrium.

8. The semiconductor device of claim 1, wherein at least one of the first high-k dielectric layer and the second high-k dielectric layer is an oxide of hafnium.

9. The semiconductor device of claim 1, wherein the first high-k dielectric layer and the second high-k dielectric layer each have a dielectric constant above approximately 12.

10. The semiconductor device of claim 1, wherein the first high-k dielectric layer has a thickness of about 10 Å-30 Å, and the second high-k dielectric layer has a thickness of about 1 Å-6 Å.

11. A method of forming a semiconductor device stack, comprising:
    forming an interfacial layer on a substrate;
    forming a first high-k dielectric layer over the interfacial layer;
    forming a Ti-dopant mixing layer directly over the first high-k dielectric layer;
    forming a second high-k dielectric layer over the over the Ti-dopant mixing layer; and
    forming a gate electrode layer over the second high-k dielectric layer.

12. The method of claim 11, further comprising forming a Ti—Si mixing layer directly over the second high-k dielectric layer.

13. The method of claim 11, further comprising:
    depositing a high-k dielectric material on the Ti-dopant mixing layer to form the second high-k dielectric layer;
    inducing a dipole at an interface between the interfacial layer and the first high-k dielectric layer; and
    forming a Ti—Si mixing layer directly over the second high-k dielectric layer.

14. The method of claim 11, further comprising:
    inducing a dipole at an interface between the interfacial layer and the first high-k dielectric layer;
    removing the Ti-dopant mixing layer;
    forming a Ti—Si mixing layer over the first high-k dielectric layer; and
    depositing a high-k dielectric material on the Ti—Si mixing layer to form the second high-k dielectric layer.

15. The method of claim 11, wherein the Ti-dopant mixing layer comprises a dopant selected from the group consisting of lanthanum, magnesium, aluminum, and yttrium.

16. The method of claim 11, further comprising forming a second gate electrode layer over the gate electrode layer.

17. The method of claim 11, wherein the forming the Ti-dopant mixing layer comprises:
    forming a blocking layer over a dipole-inducing dopant material;
    patterning the blocking layer; and
    thinning the patterned blocking layer.

18. The method of claim 11, wherein the gate electrode layer is selected from the group consisting of TiN, polysilicon, aluminum, tungsten, TiAlC, TiAl, Ti, a silicide, ruthenium(IV) oxide, WN/RuO2, tantalum, niobium, and tantalum nitride.

19. The method of claim 11, further comprising, before forming the gate electrode layer, inducing a dipole between the interfacial layer and the first high-k dielectric layer.

20. The method of claim 19, wherein the inducing comprises forming an annealing stack comprising a film of TiN on the Ti-dopant mixing layer.

* * * * *